United States Patent
Higuchi et al.

(10) Patent No.: US 7,521,134 B2
(45) Date of Patent: *Apr. 21, 2009

(54) POTASSIUM NIOBATE DEPOSITED BODY AND METHOD FOR MANUFACTURING THE SAME, SURFACE ACOUSTIC WAVE ELEMENT, FREQUENCY FILTER, OSCILLATOR, ELECTRONIC CIRCUIT, AND ELECTRONIC APPARATUS

(75) Inventors: Takamitsu Higuchi, Matsumoto (JP); Taku Aoyama, Setagaya (JP)

(73) Assignee: Seiko Epson Corporation (JP)

( * ) Notice: Subject to any disclaimer, the term of this patent is extended or adjusted under 35 U.S.C. 154(b) by 544 days.

This patent is subject to a terminal disclaimer.

(21) Appl. No.: 11/334,712

(22) Filed: Jan. 18, 2006

(65) Prior Publication Data
US 2006/0197406 A1    Sep. 7, 2006

(30) Foreign Application Priority Data
Mar. 4, 2005    (JP) .............................. 2005-060915

(51) Int. Cl.
H01L 41/08    (2006.01)
H01L 41/00    (2006.01)
H01R 9/00    (2006.01)
B32B 9/00    (2006.01)

(52) U.S. Cl. ................... 428/701; 29/25.35; 310/311; 310/313 R; 310/360; 423/594.8

(58) Field of Classification Search ................ 310/311, 310/311 R, 360; 29/25, 35; 423/594.8; 428/469, 428/701

See application file for complete search history.

(56) References Cited

U.S. PATENT DOCUMENTS

| | | | | |
|---|---|---|---|---|
| 4,224,548 A | * | 9/1980 | O'Connell | 310/360 |
| 4,232,240 A | * | 11/1980 | O'Connell | 310/313 A |
| 5,498,920 A | * | 3/1996 | Okano et al. | 310/313 A |
| 5,936,329 A | * | 8/1999 | Shibata et al. | 310/360 |
| 6,183,555 B1 | * | 2/2001 | Shibata et al. | 117/98 |

(Continued)

FOREIGN PATENT DOCUMENTS

JP    2004-224627    8/2004

(Continued)

OTHER PUBLICATIONS

H. Odagawa, K. Yamanouchi, Superhigh Electromechanical Coupling and Zero-Temperature Characteristics of $KNbO_3$ and Wide Band Filter Applications, Jpn. J. Appl. Phys. vol. 37 (1998) 2929.

*Primary Examiner*—John J. Zimmerman
*Assistant Examiner*—Aaron Austin
(74) *Attorney, Agent, or Firm*—Harness, Dickey & Pierce, P.L.C.

(57) ABSTRACT

A potassium niobate deposited body in accordance with an embodiment of the invention includes an R-plane sapphire substrate, and a potassium niobate layer or a potassium niobate solid solution layer formed above the R-plane sapphire substrate, wherein the potassium niobate layer or the potassium niobate solid solution layer epitaxially grows in a (100) orientation in a pseudo cubic system expression, and the potassium niobate layer or the potassium niobate solid solution layer has a (100) plane that tilts with a [11-20] direction vector as a rotation axis with respect to an R-plane (1-102) of the R-plane sapphire substrate.

19 Claims, 13 Drawing Sheets

U.S. PATENT DOCUMENTS

| | | | |
|---|---|---|---|
| 7,265,482 B2 * | 9/2007 | Higuchi et al. | 310/360 |
| 7,310,874 B2 * | 12/2007 | Higuchi et al. | 29/842 |
| 7,345,408 B2 * | 3/2008 | Higuchi et al. | 310/360 |
| 7,422,807 B2 * | 9/2008 | Higuchi et al. | 428/701 |
| 2004/0189425 A1 | 9/2004 | Iwashita | |
| 2004/0197599 A1 | 10/2004 | Higuchi | |
| 2004/0237882 A1 | 12/2004 | Higuchi | |
| 2005/0200235 A1* | 9/2005 | Higuchi et al. | 310/313 R |
| 2006/0222895 A1* | 10/2006 | Higuchi et al. | 428/701 |

FOREIGN PATENT DOCUMENTS

| | | |
|---|---|---|
| JP | 2004-235874 | 8/2004 |
| JP | 2004-292226 | 10/2004 |
| JP | 2004-292228 | 10/2004 |
| JP | 2006245413 A * | 9/2006 |
| JP | 2006278870 A * | 10/2006 |
| JP | 2006279532 A * | 10/2006 |
| JP | 2006279713 A * | 10/2006 |
| WO | WO 02080359 A2 * | 10/2002 |

* cited by examiner

MgO (202)
(2θ = 62.3°)

KNbO₃ (101)pc
(2θ = 31.5°)

POTASSIUM NIOBATE DEPOSITED BODY AND METHOD FOR MANUFACTURING THE SAME, SURFACE ACOUSTIC WAVE ELEMENT, FREQUENCY FILTER, OSCILLATOR, ELECTRONIC CIRCUIT, AND ELECTRONIC APPARATUS

The entire disclosure of Japanese Patent Application No. 2005-060915, filed Mar. 4, 2005 is expressly incorporated by reference herein.

BACKGROUND

1. Technical Field

The present invention relates to potassium niobate deposited bodies and methods for manufacturing the same, surface acoustic wave elements, frequency filters, oscillators, electronic circuits, and electronic apparatuses.

2. Related Art

Accompanying the considerable development in the telecommunications field, the demand for surface acoustic wave elements is rapidly expanding. The development of surface acoustic wave elements is directed toward achieving further miniaturization, higher efficiency and higher frequency. In order to achieve this, higher electromechanical coupling coefficient, more stable temperature characteristics and greater surface acoustic wave propagation speed are needed.

It has been found that a single crystal substrate of potassium niobate ($KNbO_3$) (a=0.5695 nm, b=0.3973 nm, and c=0.5721 nm; hereafter this index expression is followed as "orthorhombic crystal") exhibited a large value of electromechanical coupling coefficient. For example, as described in Jpn. J. Appl. Phys. Vol. 37 (1998) 2929, it was confirmed by experiments that a 0° Y-cut X propagation $KNbO_3$ single crystal substrate (hereafter referred to as a "0° Y—X—$KNbO_3$ substrate") would exhibit a very large value of electromechanical coupling coefficient reaching as much as about 50%. Also, the same reference reports that the oscillation frequency of a filter using 45° to 75° rotated Y-cut X propagation $KNbO_3$ single crystal substrate (hereafter referred to as a "rotated Y—X—$KNbO_3$ substrate") exhibited a zero-temperature characteristic around room temperature.

In a surface acoustic wave element that uses a piezoelectric single crystal substrate, its electromechanical coupling coefficient, temperature coefficient, and acoustic velocity define values peculiar to the piezoelectric material used, and are decided according to a cut angle and a propagation direction. 0° Y—X—$KNbO_3$ single crystal substrates exhibit an excellent electromechanical coupling coefficient, but do not exhibit a zero-temperature characteristic like 45° to 75° rotated Y—X—$KNbO_3$ substrates around room temperature. Moreover, the acoustic velocity of a 0° Y—X—$KNbO_3$ single crystal substrate is lower compared to $SrTiO_3$ which is the same perovskite type oxide. Thus, all of the requirements of high electromechanical coupling coefficient, zero-temperature characteristic and high acoustic velocity cannot be satisfied by merely using a $KNbO_3$ single crystal substrate. Moreover, it may be difficult to manufacture a surface acoustic wave element by forming a thin film of potassium niobate on a certain substrate having a large area.

SUMMARY

In accordance with an aspect of the present invention, there are provided a potassium niobate deposited body having a potassium niobate thin film, and a method for manufacturing the same.

In accordance with another aspect of the invention, a surface acoustic wave element with a high electromechanical coupling coefficient is provided.

In accordance with still another aspect of the invention, frequency filters, oscillators, electronic circuits, and electronic equipment including the surface acoustic wave element are provided.

A potassium niobate deposited body in accordance with an embodiment of the invention includes:

an R-plane sapphire substrate; and
a potassium niobate layer or a potassium niobate solid solution layer formed above the R-plane sapphire substrate,
wherein the potassium niobate layer or the potassium niobate solid solution layer epitaxially grows in a (100) orientation in a pseudo cubic system expression, and
the potassium niobate layer or the potassium niobate solid solution layer has a (100) plane that tilts with a [11-20] direction vector as a rotation axis with respect to an R-plane (1-102) of the R-plane sapphire substrate.

According to the potassium niobate deposited body described above, the (100) plane of the potassium niobate layer or the potassium niobate solid solution layer tilts with a [11-20] direction vector as a rotation axis with respect to the R-plane (1-102) of the R-plane sapphire substrate. By using the above-described potassium niobate deposited body having the potassium niobate layer or potassium niobate solid solution layer described above, a surface acoustic wave element having a high electromechanical coupling coefficient can be obtained.

It is noted that, in the invention, forming another specific member (hereafter referred to as "B") above a specific member (hereafter referred to as "A") includes a case of forming "B" directly on "A," and a case of forming "B" over "A" through another member on "A." Also, in the invention, "B" formed above "A" includes "B" formed directly on "A," and "B" formed above "A" through another member on "A."

In the potassium niobate deposited body in accordance with an aspect of the invention, an angle defined between the (100) plane of the potassium niobate layer or the potassium niobate solid solution layer and the R-plane (1-102) of the R-plane sapphire substrate may be one degree or greater but 15 degrees or smaller.

In the potassium niobate deposited body in accordance with an aspect of the invention, the potassium niobate layer may include a domain that epitaxially grows in a b-axis orientation, when a lattice constant of orthorhombic potassium niobate is $2^{1/2}$ b<a<c, and a c-axis is a polarization axis, and the b-axis may tilt with a [11-20] direction vector as a rotation axis with respect to the R-plane (1-102) of the R-plane sapphire substrate.

In the potassium niobate deposited body in accordance with an aspect of the invention, an angle defined between the b-axis and the R-plane (1-102) of the R-plane sapphire substrate may be one degree or greater but 15 degrees or smaller.

The potassium niobate deposited body in accordance with an aspect of the invention may include a buffer layer formed above the R-plane sapphire substrate, wherein the potassium niobate layer or the potassium niobate solid solution layer may be formed above the buffer layer.

In the potassium niobate deposited body in accordance with an aspect of the invention, the buffer layer may epitaxially grow in a cubic (100) orientation, and a (100) plane of the buffer layer tilts with a [11-20] direction vector as a rotation axis with respect to the R-plane (1-102) of the R-plane sapphire substrate.

A potassium niobate deposited body in accordance with another embodiment of the invention includes:
- an R-plane sapphire substrate;
- a buffer layer formed above the R-plane sapphire substrate; and
- a potassium niobate layer or a potassium niobate solid solution layer formed above the buffer layer,
- wherein the buffer layer epitaxially grows in a cubic (100) orientation, and a (100) plane of the buffer layer tilts with a [11-20] direction vector as a rotation axis with respect to an R-plane (1-102) of the R-plane sapphire substrate.

In the potassium niobate deposited body in accordance with an aspect of the invention, an angle defined between the (100) plane of the buffer layer and the R-plane (1-102) of the R-plane sapphire substrate may be one degree or greater but 15 degrees or smaller.

In the potassium niobate deposited body in accordance with an aspect of the invention, the buffer layer may consist of a metal oxide having a rock salt structure.

In the potassium niobate deposited body in accordance with an aspect of the invention, the metal oxide may be magnesium oxide.

In the potassium niobate deposited body in accordance with an aspect of the invention, the potassium niobate solid solution layer may be a solid solution that is expressed by $K_{1-x}Na_xNb_{1-y}Ta_yO_3$ (0<x<1, 0<y<1).

A method for manufacturing a potassium niobate deposited body in accordance with still another embodiment of the invention includes: forming above an R-plane sapphire substrate a potassium niobate layer or a potassium niobate solid solution layer that epitaxially grows in a (100) orientation in a pseudo cubic system expression, wherein a (100) plane of the potassium niobate layer or the potassium niobate solid solution layer is formed to tilt with a [11-20] direction vector as a rotation axis with respect to an R-plane (1-102) of the R-plane sapphire substrate.

A method for manufacturing a potassium niobate deposited body in accordance with an embodiment of the invention includes: forming a buffer layer that epitaxially grows in a cubic (100) orientation above an R-plane sapphire substrate, and forming a potassium niobate layer or a potassium niobate solid solution layer above the buffer layer, wherein a (100) plane of the buffer layer is formed to tilt with a [11-20] direction vector as a rotation axis with respect to an R-plane (1-102) of the R-plane sapphire substrate.

A surface acoustic wave element in accordance with an embodiment of the invention includes the potassium niobate deposited body described above.

A frequency filter in accordance with an embodiment of the invention includes the surface acoustic wave element described above.

An oscillator in accordance with an embodiment of the invention includes the surface acoustic wave element described above.

An electronic circuit in accordance with an embodiment of the invention includes at least one of the frequency filter and the oscillator described above.

An electronic apparatus in accordance with an embodiment of the invention includes the electronic circuit described above.

DESCRIPTION OF EXEMPLARY EMBODIMENTS

Preferred embodiments of the present invention are described below with reference to the accompanying drawings.

Figure 1:
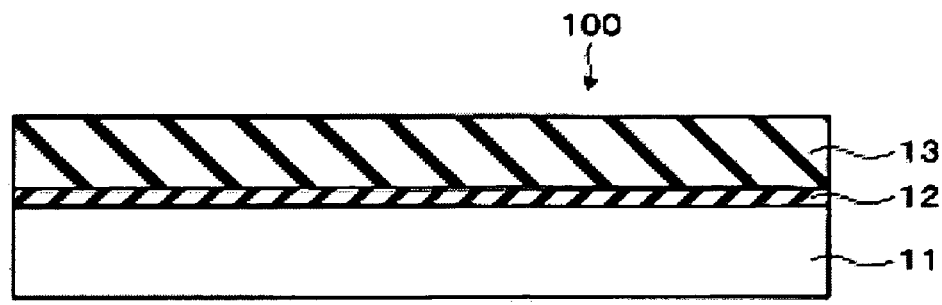
FIG. 1 is a cross-sectional view schematically showing a potassium niobate deposited body in accordance with a first embodiment of the invention.

1. First Embodiment 1.1. FIG. 1 is a cross-sectional view schematically showing a potassium niobate deposited body 100 in accordance with an embodiment of the invention. As shown in FIG. 1, the potassium niobate deposited body 100 in accordance with the present embodiment includes a substrate 11, a buffer layer 12 formed on the substrate 11, and a potassium niobate layer 13 formed on the buffer layer 12.

An R-plane sapphire substrate may be used as the substrate 11. The use of an R-plane sapphire substrate is desirable because the buffer layer 12 and the potassium niobate layer 13 can be epitaxially grown thereon, a large surface area substrate can be obtained at a low price, and the R-plane sapphire substrate has a tolerance to etchant and can be used repeatedly.

As the buffer layer 12, for example, a metal oxide having a rock salt structure can be used. For example, magnesium oxide (MgO) may be used as the metal oxide having a rock salt structure. The buffer layer 12 shall be described in detail below.

The potassium niobate layer 13 has single crystal potassium niobate or polycrystal crystal potassium niobate. The thickness of the potassium niobate layer 13 can be appropriately selected according to devices to which the potassium niobate deposited body is applied without any particular limitation, but for example, may be 100 nm or greater but 10 μm or less. The potassium niobate layer 13 shall be described in detail below.

In the present embodiment, instead of the potassium niobate layer 13 described above, it may be a layer of potassium niobate solid solution in which a part of niobium and potassium of potassium niobate is replaced with other elements. As the potassium niobate solid solution, for example, a potassium sodium niobate tantalate solid solution expressed by $K_{1-x}Na_xNb_{1-y}Ta_yO_3$ (0<x<1, 0<y<1) can be enumerated. The same similarly applies to embodiments to be described below.

1.2. Next, a method for manufacturing a potassium niobate deposited body 100 is described.

(1) First, as shown in FIG. 1, a substrate composed of an R-plane sapphire substrate (hereafter also referred to as an "R-plane sapphire substrate") 11 is prepared. The R-plane sapphire substrate 11 has been degreased and washed beforehand. Degreasing and washing can be conducted by soaking the R-plane sapphire substrate in an organic solvent with an ultrasonic washing machine. The organic solvent is not particularly limited, but may be a mixed solution of ethyl alcohol and acetone.

(2) Next, a buffer layer 12 that consists of MgO is formed on the R-plane sapphire substrate 11 by a laser ablation method, as shown in FIG. 1.

More specifically, after the R-plane sapphire substrate 11 that has been degreased and washed is loaded onto a substrate holder, it is introduced together with the substrate holder in a vacuum apparatus whose back pressure at room temperature is $1\times10^{-8}$ Torr. Next, oxygen gas is introduced such that the oxygen partial pressure becomes $5\times10^{-5}$ Torr, for example, and then the substrate is heated to elevate its temperature up to 400° C. at a rate of 20° C./minute with an infrared ray lamp.

It is noted that the conditions such as the rate of temperature elevation, substrate temperature, pressure, etc. are not limited to the above.

Next, a plume is generated by a laser ablation method in which a laser beam is irradiated to a magnesium target for a buffer layer, thereby pounding out magnesium atoms from the target. Then, this plume is irradiated toward the R-plane sapphire substrate 11, and brought in contact with the R-plane sapphire substrate 11, whereby a buffer layer 12 composed of MgO with a cubic (100) orientation is formed by epitaxial growth on the R-plane sapphire substrate 11. A (100) plane of the buffer layer 12 may preferably tilt with a [11-20] direction vector as a rotation axis with respect to an R-plane (1-102) (hereafter also simply referred to as an "R-plane") of the R-plane sapphire substrate 11. This is described with reference to FIG. 2 and FIG. 3.

Figure 2:
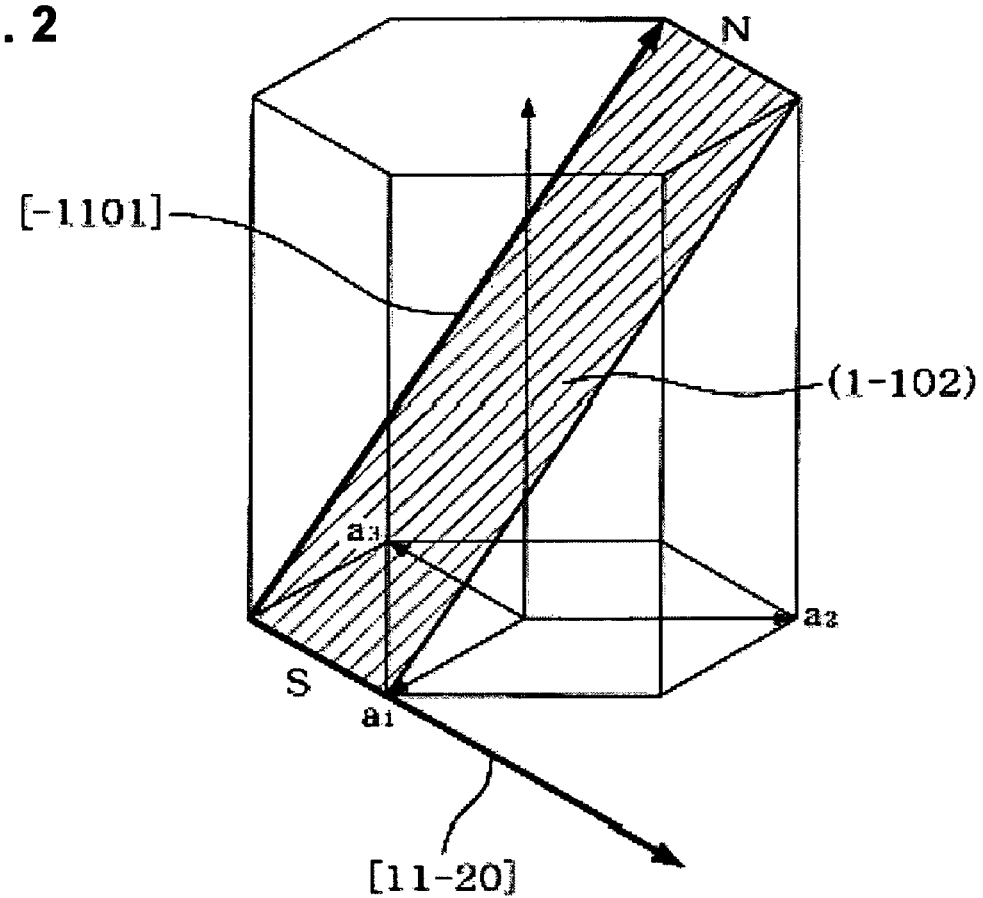
FIG. 2 is a view schematically showing a hexagonal sapphire crystal.
Figure 3:
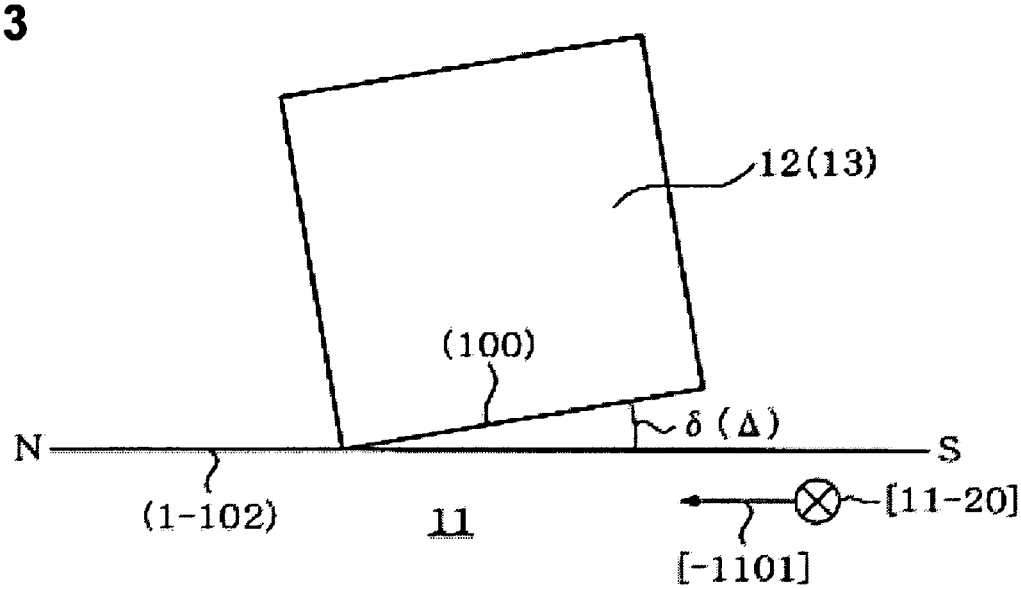
FIG. 3 is a view schematically showing a tilt between a buffer layer and a potassium niobate layer.

FIG. 2 is a view schematically showing a hexagonal sapphire crystal, and FIG. 3 is a view schematically showing a tilt of the (100) plane of the buffer layer 12. The R-plane (1-102) of the R-plane sapphire substrate 11 corresponds to an N-S plane in FIG. 2. As shown in FIG. 3, with respect to the N-S plane (in other words, the R-plane) of the R-plane sapphire substrate 11, the (100) plane of the buffer layer 12 tilts with the [11-20] direction vector as a rotation axis. In other words, a linear line defined at a crossing between the (100) plane of the buffer layer 12 and the R-plane extends in parallel with the [11-20] direction vector. By forming such a buffer layer 12, a desired potassium niobate layer 13 to be described below can be obtained. An angle δ defined between the (100) plane of the buffer layer 12 and the R-plane (1-102) of the R-plane sapphire substrate 11 may preferably be one degree or greater but 15 degrees or smaller.

Also, by using MgO as the buffer layer 12, the dielectric property of the potassium niobate layer 13 may not be deteriorated even when $Mg^{2+}$ substitutes $Nb^{5+}$ in the potassium niobate layer 13 and $K(Mg, Nb)O_3$ is generated.

The thickness of the buffer layer 12 is not particularly limited, but may be 5 nm or greater but 100 nm or less, in view of preventing the R-plane sapphire substrate 11 and the potassium niobate layer 13 from reacting each other, and preventing the potassium niobate layer 13 from being deteriorated due to the deliquescence of magnesium oxide itself.

As the method to pound out magnesium atoms or desired atoms from a target in a later step, besides the method of irradiating a laser beam to a target surface described above, for example, a method of irradiating (injecting) argon gas (inert gas) plasma or an electron beam to a target surface can also be used. However, the method of irradiating a laser beam to a target surface is desirable among them. According to such a method, atoms can be readily and securely pounded out from a target, with a vacuum apparatus having a simple structure equipped with an incident window of a laser beam.

The laser beam to be irradiated to a target may preferably be a pulsed beam with a wavelength of about 150-300 nm, and a pulse length of about 1-100 ns. More specifically, the laser beam may be, for example, an excimer laser such as an ArF excimer laser, a KrF excimer laser, a XeCl excimer laser, or the like, a YAG laser, a $YVO_4$ laser, a $CO_2$ laser or the like. Among the above, the ArF excimer laser and the KrF excimer laser are particularly preferred. The ArF excimer laser and the KrF excimer laser are easy to handle, and can effectively pound atoms from a target.

Each of the conditions at the time of laser beam irradiation is not particularly limited as long as the plume can sufficiently reach the substrate 11, and MgO as the buffer layer 12 can be epitaxially grown. The conditions at the time of laser beam irradiation may be as follows. For example, the energy density of the laser beam may preferably be between 2 J/cm² and 4 J/cm². The frequency of the laser beam may preferably be between 5 Hz and 20 Hz. The distance between the target and the substrate 11 (hereafter referred to as the "target-to-substrate distance") may preferably be between 30 mm and 100 mm. The temperature of the substrate may preferably be between 300° C. and 600° C. The partial pressure of oxygen during deposition may preferably be between $1 \times 10^{-5}$ Torr and $1 \times 10^{-3}$ Torr.

(3) Next, as shown in FIG. 1, a potassium niobate layer 13 is formed by a laser ablation method on the buffer layer 12.

More specifically, a plume is generated by a laser ablation method in which a laser beam is irradiated to a target for the buffer layer, for example, a $K_{0.6}Nb_{0.4}O_y$ target, thereby pounding out potassium, niobium and oxygen atoms from this target. Then, the plume is irradiated toward the R-plane sapphire substrate 11, and brought in contact with the buffer layer 12. As a result, a potassium niobate layer 13 in a (100) orientation in a pseudo cubic system expression is formed by epitaxial growth on the buffer layer 12. Further, as shown in FIG. 3, the (100) plane of the potassium niobate layer 13 tilts with a [11-20] direction vector as a rotation angle with respect to the R-plane (1-102) of the R-plane sapphire substrate 11. It is noted that FIG. 3 is a diagram schematically showing the tilt of the (100) plane of the buffer layer 12, as described above, and is also a diagram schematically showing the tilt of the (100) plane of the potassium niobate layer 13.

More concretely, the potassium niobate layer 13 may preferably include a domain that epitaxially grows in a b-axis orientation (which is hereafter also referred to as an "orthorhombic b-axis orientation domain"), when a lattice constant of orthorhombic potassium niobate is $2^{1/2}$ b<a<c, and a c-axis is a polarization axis. Also, the b-axis may preferably tilt with a [11-20] direction vector as a rotation axis with respect to the R-plane (1-102) of the R-plane sapphire substrate 11. When such a potassium niobate layer 13 is used, a surface acoustic wave element 200 (see FIG. 19) with a high electromechanical coupling coefficient can be obtained.

An angle Δ defined between the (100) plane of the potassium niobate layer 13 and the R-plane (1-102) of the R-plane sapphire substrate 11 may preferably be 1 degree or greater but 15 degrees or smaller. More concretely, an angle defined between the b-axis of the orthorhombic potassium niobate and the R-plane (1-102) of the R-plane sapphire substrate 11 may preferably be 1 degree or greater but 15 degrees or smaller. It is noted that the angle Δ defined between the (100) plane of the potassium niobate layer 13 and the R-plane can be the same as or different from the angle δ defined between the (100) plane of the buffer layer 12 and the R-plane.

The conditions of the laser ablation method are not particularly limited as long as the plume can sufficiently reach the buffer layer 12. The conditions at the time of laser beam irradiation may be as follows. For example, the energy density of the laser beam may preferably be between 2 J/cm² and 4 J/cm². The frequency of the laser beam may preferably be between 5 Hz and 20 Hz. The target-to-substrate distance may preferably be between 30 mm and 100 mm. The temperature of the substrate may preferably be between 600° C. and 800° C. The partial pressure of oxygen during deposition may preferably be between $1 \times 10^{-2}$ Torr and 1 Torr.

In this embodiment, by selecting each of the conditions at the time of laser ablation, pottasium niobate can be made to have a single crystal or polycrystal (preferably polycrystal in a single phase) structure.

In the above-described example, a $K_{0.6}Nb_{0.4}O_y$ target is used. However, the composition ratio of the target is not limited to the above. For example, for the formation of the potassium niobate layer 13, it is possible to use a target having a composition ratio that is suitable for conducting a Tri-Phase-Epitaxy method. Tri-Phase-Epitaxy method is a method in which a vapor phase raw material is deposited on a substrate that is maintained at temperatures in a solid-liquid coexisting region, and a solid phase is precipitated from a liquid phase.

Concretely, a plume that is a raw material in a vapor phase is supplied to a base substrate (which, in this embodiment, consists of the substrate 11 and the buffer layer 12) such that the mole composition ratio x of potassium in $K_xNb_{1-x}O_y$ in the state of a liquid phase immediately after being deposited on the base substrate is in the range of $0.5 \leq x \leq x_E$. It is noted that $x_E$ is a mole composition ratio x at an eutectic point of $KNbO_3$ and $3K_2O \cdot Nb_2O_5$ under a predetermined oxygen partial pressure. Then, by maintaining the temperature $T_s$ of the base substrate within the range of $T_E \leq T_s \leq T_m$, the remaining liquid of $K_xNb_{1-x}O_y$ deposited on the base substrate supplied from the plume is evaporated. By this, $KNbO_3$ single crystal can be precipitated from $K_xNb_{1-x}O_y$ on the base substrate. It is noted that $T_E$ is a temperature at an eutectic point of $KNbO_3$ and $3K_2O \cdot Nb_2O_5$ under a predetermined oxygen partial pressure. Also, $T_m$ is a complete melting temperature under a predetermined oxygen partial pressure of $K_xNb_{1-x}O_y$ in the state of a liquid phase immediately after being deposited on the base substrate.

By the steps described above, the potassium niobate deposited body 100 shown in FIG. 1 can be formed.

In addition, a polishing process to planarize the surface of the potassium niobate layer 13 can be conducted if necessary. Buff polishing, CMP (Chemical Mechanical Polishing) or the like can be used as such a polishing process.

It is noted that, in the present embodiment, a laser ablation method is used as a film forming method for forming the buffer layer 12 and the potassium niobate layer 13. However, the film forming method is not limited to this, and, for example, a vapor deposition method, a MOCVD method, and a sputter method can be used.

1.3. According to the present embodiment, a buffer layer 12 composed of MgO in a cubic (100) orientation is formed on a R-plane sapphire substrate 11, and a potassium niobate layer 13 is formed on the buffer layer 12 by using a vapor phase method. By this, a single phase thin film of potassium niobate can be epitaxially grown in a b-axis orientation. By using the potassium niobate layer 13, a surface acoustic wave element 200 (see FIG. 19) having a high electromechanical coupling coefficient can be obtained, as described below.

Furthermore, in accordance with the present embodiment, a (100) plane of the potassium niobate layer 13 tilts with a [11-20] direction vector as a rotation angle with respect to an R-plane (1-102) of the R-plane sapphire substrate 11. By using the potassium niobate layer 13, a surface acoustic wave element 200 having a higher electromechanical coupling coefficient can be obtained, as described below.

1.4. Experimental Examples (1) First, a first experimental example is described. In the present experimental example, a potassium niobate deposited body 100 was formed according to a method described below. In the present experimental example, a thin film of polycrystal potassium niobate in a single phase could be obtained.

First, a substrate 11 composed of an R-plane sapphire single crystal plate was degreased and washed through soaking the substrate 11 in an organic solvent with an ultrasonic washing machine. As the organic solvent, a 1:1 mixed solution of ethyl alcohol and acetone was used. After loading the substrate 11 onto a substrate holder, it was introduced together with the substrate holder in a vacuum apparatus whose back pressure at room temperature was $1\times10^{-8}$ Torr, oxygen gas was introduced such the oxygen partial pressure became $5\times10^{-5}$ Torr, and then the substrate was heated to elevate its temperature up to 400° C. at a rate of 20° C./minute with an infrared ray lamp.

Next, a pulsed beam of KrF excimer laser (with a wavelength of 248 nm) was injected in a surface of a magnesium target under conditions with an energy density being 2.5 J/cm$^2$, a frequency being 10 Hz, and a pulse length being 10 ns, thereby generating a plasma plume of magnesium on the target surface. The plasma plume was irradiated to the substrate 11 under conditions with a substrate temperature being 400° C. and an oxygen partial pressure being $5\times10$ Torr, whereby a buffer layer 12 consisting of MgO was formed. The target-to-substrate distance was 70 mm, the irradiation time was 30 minutes, and the film thickness of the buffer layer 12 was 10 nm.

Next, a pulsed beam of KrF excimer laser was injected in a surface of a $K_{0.6}Nb_{0.4}O_y$ target under conditions with an energy density being 3 J/cm$^2$, a frequency being 10 Hz, and a pulse length being 10 ns, thereby generating a plasma plume of K, Nb and O on the target surface. The plasma plume was irradiated to the substrate 11 under conditions with a substrate temperature being 750° C. and an oxygen partial pressure being $1\times10^{-1}$ Torr, whereby a pottasium niobate layer 13 was formed on the buffer layer 12. The target-to-substrate distance was 70 mm, the irradiation time was 240 minutes, and the film thickness of the potassium niobate layer 13 was of 1 μm.

By the steps described above, a potassium niobate deposited body 100 (see FIG. 1) was obtained.

Figure 4:
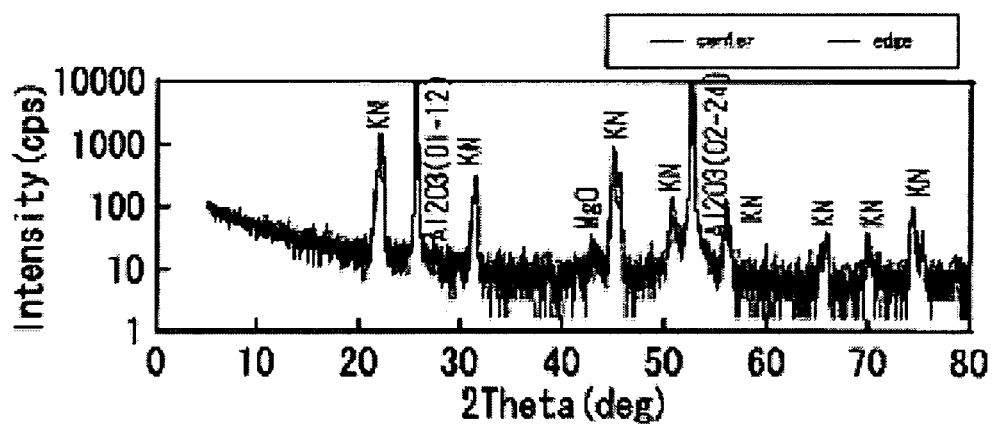
FIG. 4 is an X-ray diffraction diagram of a potassium niobate layer in accordance with a first experimental example.

An X-ray diffraction pattern (2θ-θ scanning) of the potassium niobate layer 13 obtained in the present experimental example is shown in FIG. 4. All peaks shown in the X-ray diffraction pattern of FIG. 4 belong to sapphire and potassium niobate, and peaks belonging to other compounds are not observed. Therefore, it was confirmed that the potassium niobate obtained in the present experimental example was a polycrystal but in a single phase.

(2) Next, a second experimental example is described. In the present experimental example, a potassium niobate deposited body 100 was formed by the following method. In this experimental example, a thin film of single crystal potassium niobate layer could be obtained.

Figure 5:
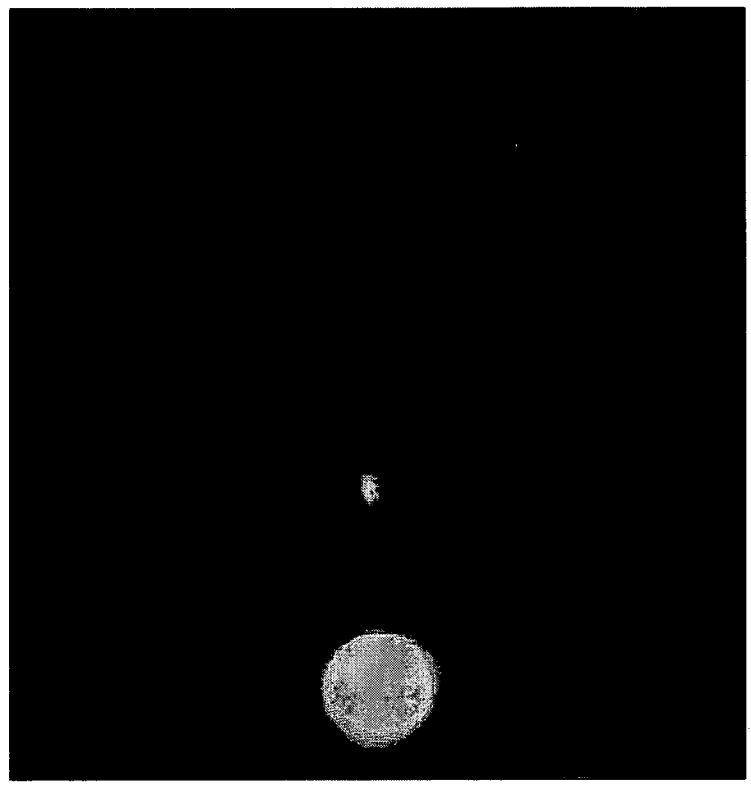
FIG. 5 is a RHEED pattern of a sapphire substrate in accordance with a second experimental example.

First, a substrate 11 composed of an R-plane sapphire single crystal substrate was degreased and washed, in a similar manner as the first experimental example. Next, in a manner similar to the first experimental example, after loading the substrate 11 onto a substrate holder, it was introduced together with the substrate holder in a vacuum apparatus, oxygen gas was introduced, and then the substrate was heated to elevate its temperature to 400° C. At this time, as shown in FIG. 5, in a pattern obtained by the reflection high speed electron beam diffraction (Reflection High Energy Electron Diffraction (RHEED)) in a sapphire [11-20] direction, kikuchi lines and strong reflection points that are characteristic to a single crystal were observed.

Next, a pulsed beam of KrF excimer laser with a frequency being 20 Hz was injected in a surface of a magnesium target, thereby generating a plasma plume of magnesium on the target surface. In this instance, the energy density, pulse length, and wavelength were the same as those of the first experimental example, respectively. The plasma plume was irradiated to the substrate 11, whereby a buffer layer consisting of MgO was formed. In this instance, the substrate temperature, oxygen partial pressure, target-to-substrate distance, irradiation time, film thickness were the same as those of the first experimental example, respectively.

Figure 6:
FIG. 6 is a RHEED pattern of a buffer layer in accordance with the second experimental example.

A RHEED pattern in a sapphire [11-20] direction of the deposited body thus obtained was investigated, and a pattern shown in FIG. 6 was obtained. A diffraction pattern appears in this RHEED pattern, and it was confirmed that the buffer layer 12 composed of MgO epitaxially grew.

Figure 7:
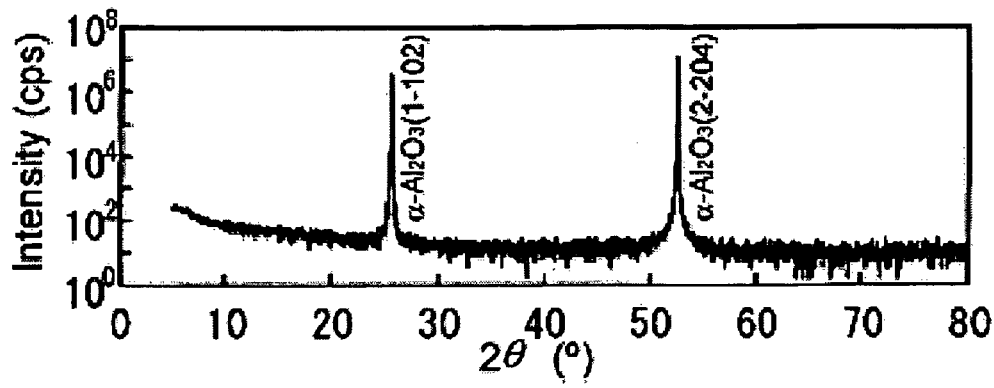
FIG. 7 is a 2θ-θ scanning X-ray diffraction diagram of the buffer layer in accordance with the second experimental example.
Figure 8:
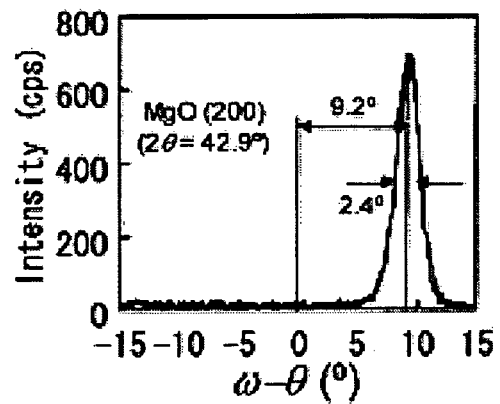
FIG. 8 is a ω scanning X-ray diffraction diagram of the buffer layer in accordance with the second experimental example.
Figure 9:
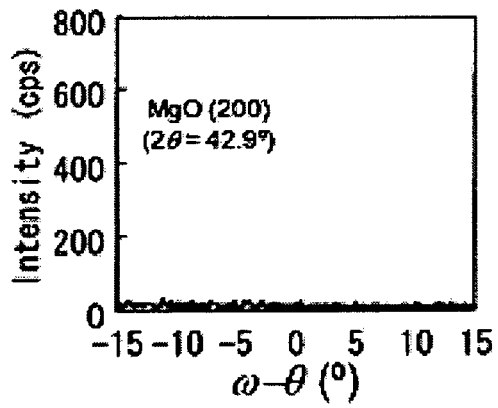
FIG. 9 is a ω scanning X-ray diffraction diagram of the buffer layer in accordance with the second experimental example.

Further, an X-ray diffraction pattern (2θ-θ scanning) of the buffer layer 12 composed of MgO in the deposited body is shown in FIG. 7. As shown in FIG. 7, no peak other than the peaks of the substrate 11 was observed. X-ray diffraction patterns (ω scanning) obtained when the value 2θ was fixed at MgO (200) (2θ=42.92° when a=0.4212 nm) are shown in FIG. 8 and FIG. 9. When the rotation axis of the ω scanning was in parallel with the sapphire [11-20], a peak shifted by 9.2° from the center was observed as shown in FIG. 8. When the rotation axis of the ω scanning was in parallel with the sapphire [−1101], no peak was observed, as shown in FIG. 9. Based on these results, it was confirmed that an MgO (100) film tilted by about 9° from the substrate 11 epitaxially grew.

Next, a pulsed beam of KrF excimer laser was injected in a surface of a $K_{0.67}Nb_{0.33}O_y$ target under conditions with an energy density being 2 J/cm$^2$, thereby generating a plasma plume of K, Nb and O on the target surface. In this instance, the frequency and pulse length were the same as those of the first experimental example. The plasma plume was irradiated to the substrate 11 under conditions with a substrate temperature being 600° C. and an oxygen partial pressure being $1\times10^{-2}$ Torr, whereby a pottasium niobate layer 13 was formed on the buffer layer 12. The film thickness of the potassium niobate layer 13 was 0.5 μm. Also, the target-to-substrate distance, and irradiation time were the same as those of the first experimental example.

By the steps described above, a potassium niobate deposited body 100 (see FIG. 1) was obtained.

Figure 10:
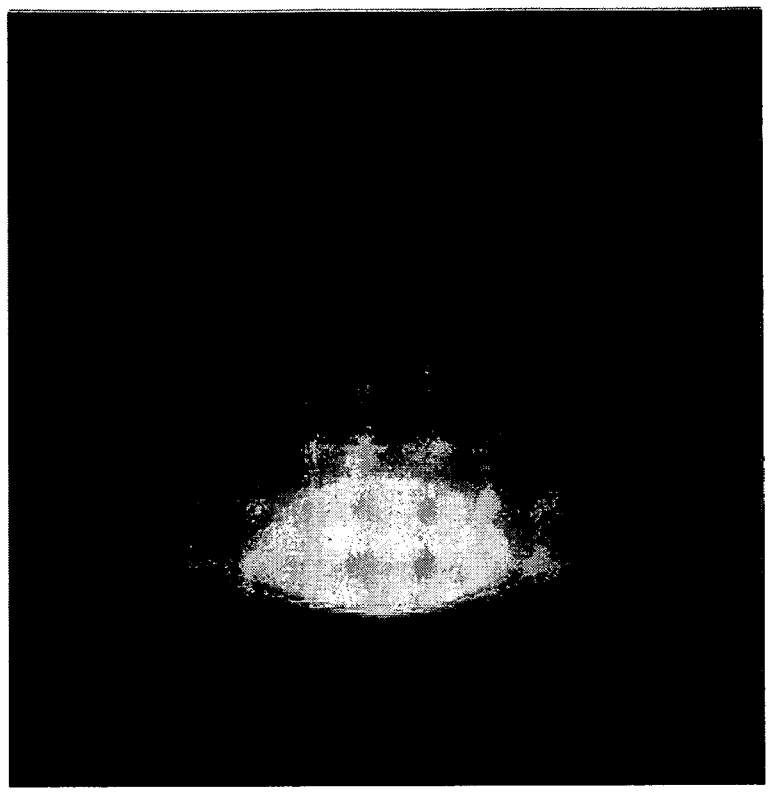
FIG. 10 is a RHEED pattern of a $KNbO_3$ layer in accordance with the second experimental example.

A RHEED pattern in a sapphire [11-20] direction of the deposited body thus obtained was investigated, and a pattern shown in FIG. 10 was obtained. A clear diffraction pattern appears in this RHEED pattern, and it was confirmed that the potassium niobate epitaxially grew.

Figure 11:
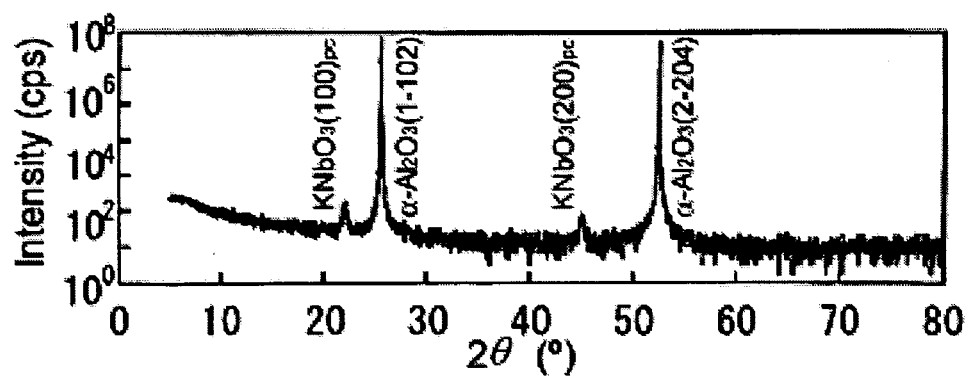
FIG. 11 is a 2θ-θ scanning X-ray diffraction diagram of the $KNbO_3$ layer in accordance with the second experimental example.
Figure 12:
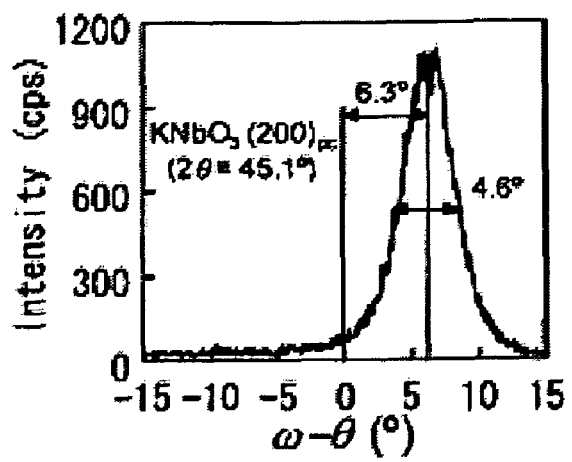
FIG. 12 is a ω scanning X-ray diffraction diagram of the $KNbO_3$ layer in accordance with the second experimental example.
Figure 13:
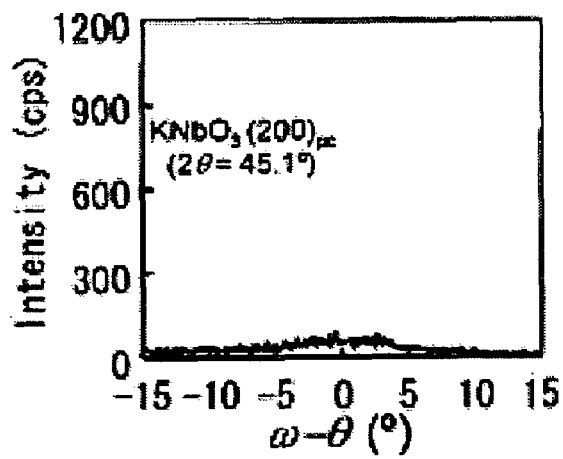
FIG. 13 is a ω scanning X-ray diffraction diagram of the $KNbO_3$ layer in accordance with the second experimental example.

Further, an X-ray diffraction pattern (2θ-θ scanning) of the potassium niobate (KNbO$_3$) layer 13 of the deposited body is shown in FIG. 11. As shown in FIG. 11, peaks of KNbO$_3$ (100)$_{pc}$, and KNbO$_3$ (200)$_{pc}$ were observed, as KNbO$_3$ is expressed by plane index of pseudo cubic. Accordingly, it was confirmed that KNbO$_3$ was (100)$_{pc}$ oriented. X-ray diffraction patterns (ω scanning) of KNbO$_3$ (200)$_{pc}$ (2θ=45.12°) are shown in FIG. 12 and FIG. 13. When the rotation axis of the ω scanning was in parallel with the sapphire [11-20], a peak shifted by 6.3° from the center was observed as shown in FIG. 12. When the rotation axis of the ω scanning was in parallel with the sapphire [−1101], no peak was observed, as shown in FIG. 13. Based on these results, it was confirmed that a KNbO$_3$ (100)$_{pc}$ film tilted by about 6° from the substrate 11 grew.

Figure 14:
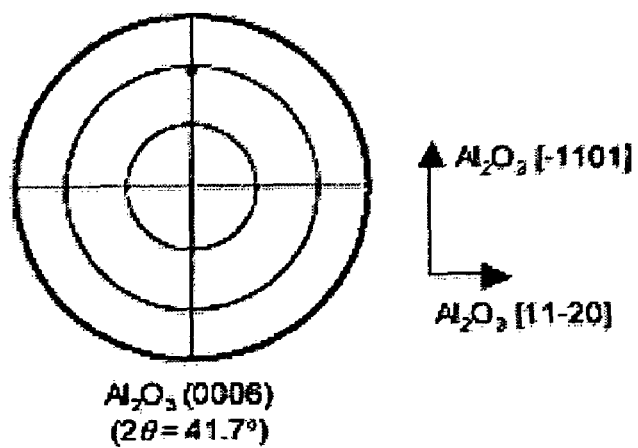
FIG. 14 is an X-ray diffraction pole figure of the sapphire substrate in accordance with the second experimental example.
Figure 15:
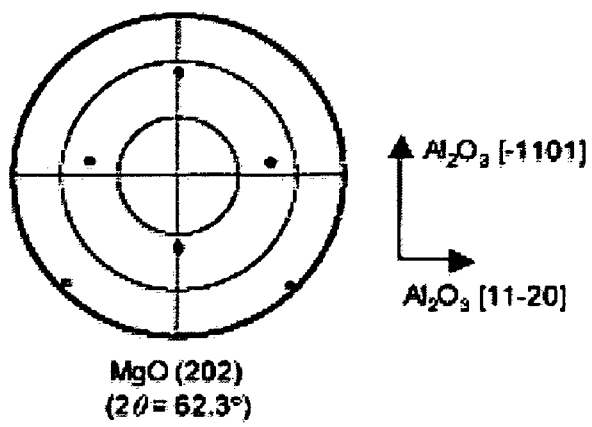
FIG. 15 is an X-ray diffraction pole figure of the buffer layer in accordance with the second experimental example.
Figure 16:
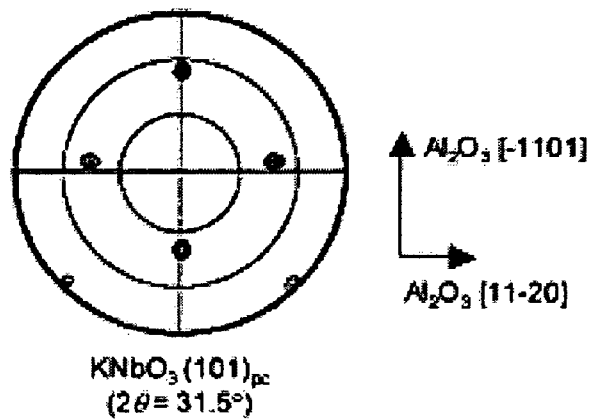
FIG. 16 is an X-ray diffraction pole figure of $KNbO_3$ in accordance with the second experimental example.

Moreover, when X-ray diffraction pole figures were investigated, the results shown in FIG. 14-FIG. 16 were obtained. FIG. 14, FIG. 15 and FIG. 16 are X-ray diffraction pole figures of sapphire (0006) (2θ=41.7°), MgO (202) (2θ=62.3°), and KNbO$_3$ (101)$_{pc}$ (2θ=31.5°), respectively. As shown in FIG. 15 and FIG. 16, spots of MgO (202) and KNbO$_3$ (101)$_{pc}$ both indicate symmetry four times, and it was found that orientations of epitaxial growth are in relation of KNbO$_3$ (100)$_{pc}$/MgO (100)/sapphire (1-102) in inter-plane, and KNbO$_3$ [010]$_{pc}$//MgO [010]//sapphire [11-20] in in-plane. Also, as shown in FIG. 15 and FIG. 16, the centers of these four spots are shifted from the center of the pole figure (Psi=0 degree) in the sapphire [−1101] direction by about 9 degrees and about 6 degrees, respectively. They coincide with the shift amounts in the ω scanning described above. Accordingly, it was confirmed that the buffer layer 12 composed of MgO epitaxially grew with its (100) plane tilted with a [11-20] direction vector as a rotation axis by about 9 degrees with respect to the R-plane of the substrate 11, and the potassium niobate layer 13 epitaxially grew with its (100) plane in a pseudo cubic expression tilted with a [11-20] direction vector as a rotation axis by about 6 degrees with respect to the R-plane of the substrate 11.

Figure 17:
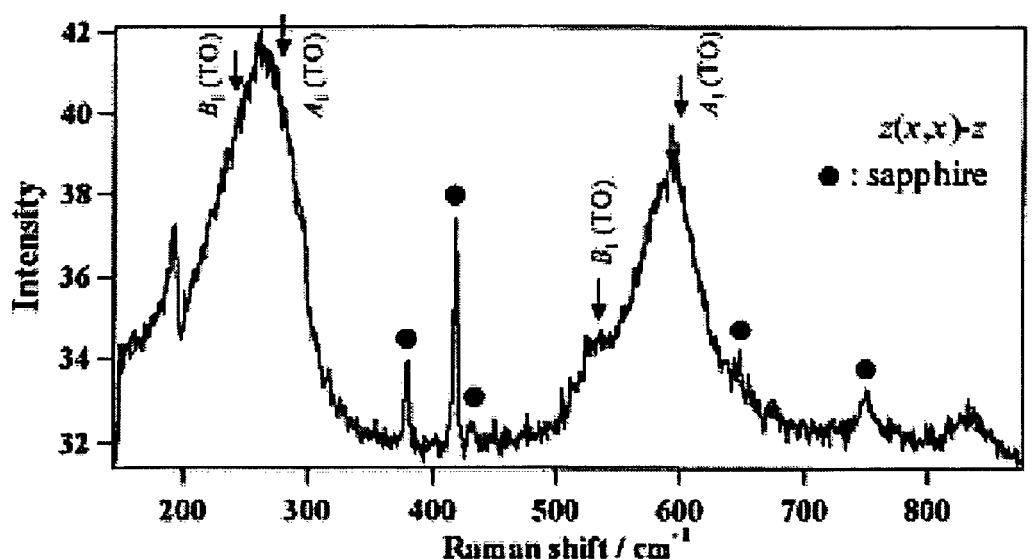
FIG. 17 is a diagram showing Raman scattering spectra of $KNbO_3$ in accordance with the second experimental example.
Figure 18:
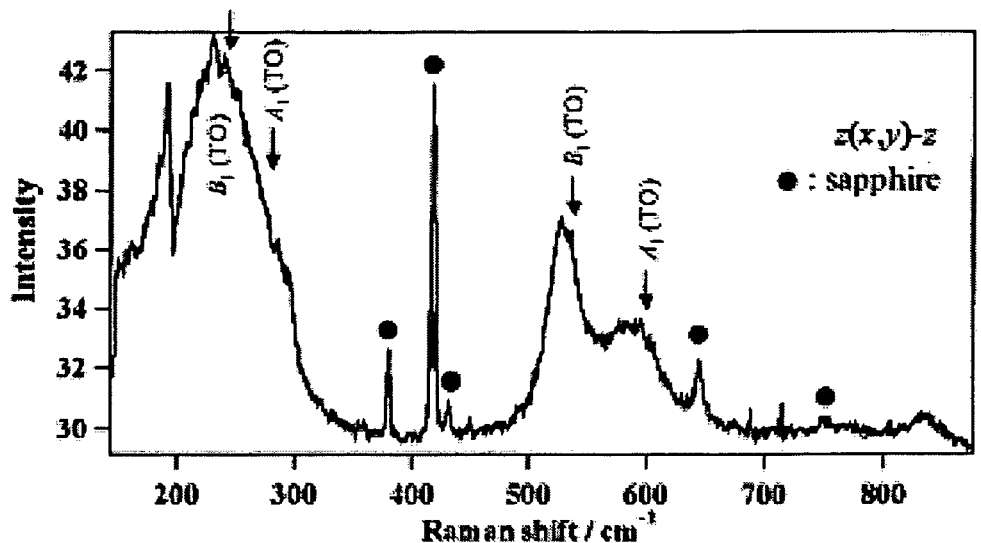
FIG. 18 is a diagram showing Raman scattering spectra of $KNbO_3$ in accordance with the second experimental example.

Also, Raman scattering spectra were measured, and results shown in FIG. 17 and FIG. 18 were obtained. FIG. 17 and FIG. 18 correspond to the geometry of z (x, x)−z, and x (x, y)−z, respectively. The formula indicating the geometry means "the direction of momentum of incident light (polarization direction of incident light, polarization direction of scattering light)—the direction of momentum of scattering light." In the geometry of z (x, x)−z, as shown in FIG. 17, peaks of the $A_1$ vibration mode near 280 $cm^{-1}$ and 600 $cm^{-1}$ are strongly observed, but peaks of the $B_1$ vibration mode near 250 $cm^{-1}$ and 530 $cm^{-1}$ are hardly observed. On the other hand, in the geometry of z (x, y)−z, as shown in FIG. 18, peaks of the $B_1$ vibration mode near 250 $cm^{-1}$ and 530 $cm^{-1}$ are strongly observed, but peaks of the $A_1$ vibration mode near 280 $cm^{-1}$ and 600 $cm^{-1}$ are hardly observed. In other words, the peak intensities of the $A_1$ vibration mode and the $B_1$ vibration mode are reversed between the case of the geometry of z (x, y)−z, and the case of the geometry of z (x, x)−z.

From these results, a consideration was made as to which one of domains that can be obtained in a pseudo cubic (100) orientation, namely, an orthorhombic (101) domain or an orthorhombic (010) domain (orthorhombic b-axis orientation domain), is predominant. Table 1 shows selection rules of phonon mode which are observed in Raman scattering spectra obtained for the respective domain structures based on the space groups. It is noted that "O" in Table 1 indicates being observable, and "N" indicates being unobservable.

tion that the (010) domain (orthorhombic b-axis orientation domain) is predominant, and this indicates that the obtained potassium niobate layer 13 is composed of an orthorhombic b-axis orientation domain.

Furthermore, based on the results of measurement of Raman scattering spectra, and the results of measurement of X-ray diffractions described above, it was confirmed that the b-axis of orthorhombic potassium niobate tilts, with a [11-20] direction vector as a rotation axis, with respect to the R-plane of the substrate 11.

Figure 19:
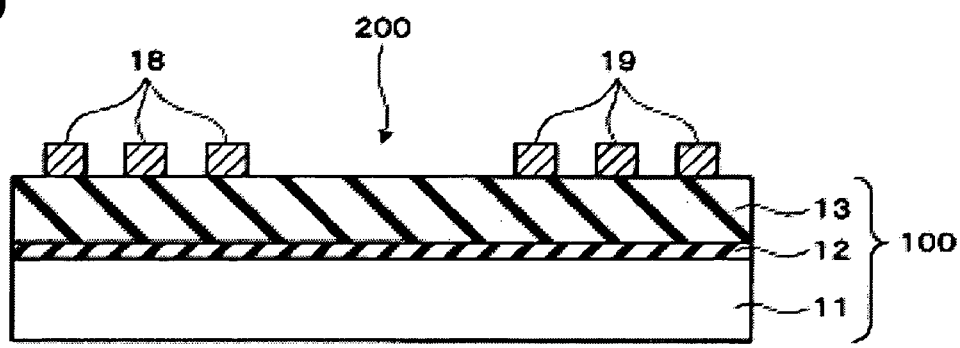
FIG. 19 is a cross-sectional view of a surface acoustic wave element in accordance with the second embodiment.

2. Second Embodiment 2.1. Next, an example of a surface acoustic wave element in accordance with a second embodiment of the invention is described with reference to the accompanying drawings. FIG. 19 is a cross-sectional view schematically showing a surface acoustic wave element 200 in accordance with the present embodiment. In FIG. 19, members that are substantially the same as the members of the potassium niobate deposited body 100 shown in FIG. 1 are appended with the same reference numbers, and their detailed description is omitted.

The surface acoustic wave element 200 includes a substrate 11, a buffer layer 12 formed on the substrate 11, a potassium niobate layer 13 formed on the buffer layer 12, and interdigital transducers (hereafter, referred to as "IDT electrodes") 18 and 19 formed on the potassium niobate layer 13. The IDT electrodes 18 and 19 have predetermined patterns.

The surface acoustic wave element 200 in accordance with the present embodiment includes a potassium niobate deposited body in accordance with an embodiment of the invention, for example, the potassium niobate deposited body 100 shown in FIG. 1. Accordingly, the potassium niobate layer 13 composing the surface acoustic wave element 200 has the same characteristics as those of the potassium niobate layer 13 of the potassium niobate deposited body 100. The potassium niobate layer 13 is composed of single crystal or polycrystal potassium niobate, as described above.

TABLE 1

| Domain Structure | Geometric Condition | $B_1(T0)$ 249 $cm^{-1}$ | $A_1(T0)$ 281.5 $cm^{-1}$ | $A_2$ 282 $cm^{-1}$ | $B_1(T0)$ 534 $cm^{-1}$ | $A_1(T0)$ 606.5 $cm^{-1}$ | $A_1(L0)$ 834 $cm^{-1}$ |
|---|---|---|---|---|---|---|---|
| (010) Domain | z(x, x) − z | N | O | N | N | O | N |
|  | z(x, y) − z | O | N | N | O | N | N |
| (101) Domain | z(x, x) − z | O | O | O | O | O | O |
|  | z(x, y) − z | O | O | O | O | O | O |

When the polarization plane of incident light and the polarization plane of scattering light are set in parallel with each other or orthogonal to each other, the polarization axis becomes to be in parallel with or orthogonal to the electric field of the incident light, respectively, in the case of the (010) domain, and therefore one of the $A_1$ and $B_1$ modes is selectively observed. On the other hand, in the case of the (101) domain, the polarization axis is positioned twisted with respect to the electric field of the incident light, and therefore both of the $A_1$ and $B_1$ modes are observed together without regard to the orientation of the polarization plane. Accordingly, the results shown in FIG. 17 and FIG. 18 coincide with the selection rules of the peaks obtained based on the assump- 2.2. The surface acoustic wave element 200 in accordance with the present embodiment is formed with a potassium niobate deposited body in accordance with the embodiment of the invention, for example, in the following manner.

First, a metal layer is formed by a vacuum vapor deposition method on the potassium niobate layer 13 of the pottasium niobate deposited body 100 shown in FIG. 1. As the metal layer, for example, aluminum can be used. Next, the metal layer is patterned by using known lithography and etching techniques, to thereby form IDT electrodes 18 and 19 on the pottasium niobate layer 13.

2.3. The surface acoustic wave element in accordance with the present embodiment has a potassium niobate deposited body in accordance with an embodiment of the invention. Therefore, in accordance with the present embodiment, a surface acoustic wave element having a high electromechanical coupling coefficient can be achieved.

2.4. Next, an example of experiments conducted on the surface acoustic wave element 200 in accordance with the present embodiment is described below.

(1) A surface acoustic wave element 200 in accordance with a first experimental example was formed by using the potassium niobate deposited body 100 of the first experimental example in accordance with the first embodiment described above. The potassium niobate deposited body 100 had a polycrystal potassium niobate layer 13 in a single phase. It is noted that, as the IDT electrodes, aluminum layers of 100 nm in thickness were used. L & S (Line and Space) of the IDT electrodes was 1.25 μm.

The propagation speed $V_{open}$ of surface acoustic wave between the IDT electrodes 18 and 19 was measured with the obtained surface acoustic wave element 200. An acoustic velocity obtained based on the measurement results was 5000 m/s. Also, an electromechanical coupling coefficient obtained based on a difference between the above and the propagation speed $V_{short}$ of surface acoustic wave when an area between the IDT electrodes 18 and 19 was covered by a metal thin film was 10%.

Also, a surface acoustic wave element 200 using potassium sodium niobate tantalate solid solution $(K_{1-x}Na_xNb_{1-y}Ta_yO_3$ (0<x<1, 0<y<1)) instead of potassium niobate ($KNbO_3$) provided similar effects.

(2) A surface acoustic wave element 200 in accordance with a second experimental example was formed by using the potassium niobate deposited body 100 of the second experimental example in accordance with the first embodiment described above. The potassium niobate deposited body 100 had a single crystal potassium niobate layer 13. The potassium niobate layer includes an orthorhombic b-axis orientation domain, and the b-axis titles, with a [11-20] direction vector as a rotation axis, with respect to the R-plane of the substrate 11. It is noted that, like the first experimental example, as the IDT electrodes, aluminum layers of 100 nm in thickness were used.

The propagation speed $V_{open}$ of surface acoustic wave between the IDT electrodes 18 and 19 was measured with the obtained surface acoustic wave element 200. An acoustic velocity obtained based on the measurement results was 5000 m/s. Also, an electromechanical coupling coefficient obtained based on a difference between the above and the propagation speed $V_{short}$ of surface acoustic wave when an area between the IDT electrodes 18 and 19 was covered by a metal thin film was 35%. As compared to the electromechanical coupling coefficient (10%) obtained when the polycrystal potassium niobate layer 13 was used (in the case of the first experimental example), it became clear that the electromechanical coupling coefficient improved when the single crystal potassium niobate layer 13 was epitaxially grown with its b-axis tilted.

Figure 20:
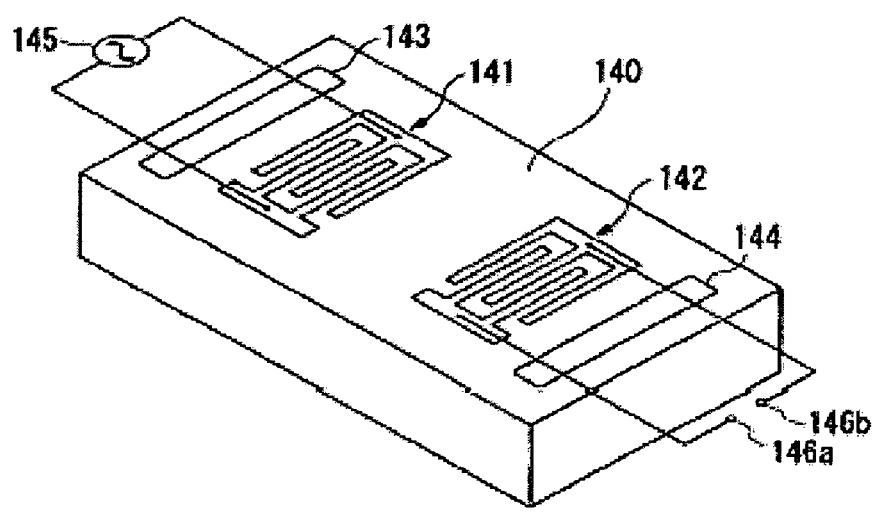
FIG. 20 is a perspective view of a frequency filter in accordance with a third embodiment of the invention.

3. Third Embodiment 3.1. Next, an example of a frequency filter in accordance with a third embodiment of the invention is described with reference to the accompanying drawings. FIG. 20 is a view schematically showing a frequency filter in accordance with the present embodiment.

As shown in FIG. 20, the frequency filter has a base substrate 140. A potassium niobate deposited body in accordance with an embodiment of the invention, for example, the potassium niobate deposited body 100 shown in FIG. 1 may be used as the base substrate 140.

IDT electrodes 141 and 142 are formed on an upper surface of the base substrate 140. Also, acoustic absorber sections 143 and 144 are formed on the upper surface of the base substrate 140 in a manner to interpose the IDT electrodes 141 and 142. The acoustic absorber sections 143 and 144 absorb surface acoustic waves that propagate over the surface of the base substrate 140. A high frequency signal source 145 is connected to the IDT electrode 141 formed on the base substrate 140, and a signal line is connected to the IDT electrode 142.

3.2. Next, operations of the frequency filter described above are described.

When a high frequency signal is outputted from the high frequency signal source 145 in the above-described structure, the high frequency signal is impressed to the IDT electrode 141, whereby a surface acoustic wave is generated on the upper surface of the base substrate 140. The surface acoustic waves propagating from the IDT electrode 141 toward the sound absorbing portion 143 are absorbed by the sound absorbing portion 143. However, among the surface acoustic waves propagating toward the IDT electrode 142, only those surface acoustic waves with a specific frequency or specific band frequency determined according to the pitch and the like of the IDT electrode 142 are converted to electric signals, and outputted to terminals 146a and 146b via the signal line. It is noted that the majority of frequency components other than the aforementioned specific frequency or specific band frequency is absorbed by the sound absorbing portion 144 after passing through the IDT electrode 142. In this way, of the electric signals supplied to the IDT electrode 141 provided in the frequency filter of the present embodiment, it is possible to obtain (filter) only surface acoustic waves of a specific frequency or specific band frequency.

Figure 21:
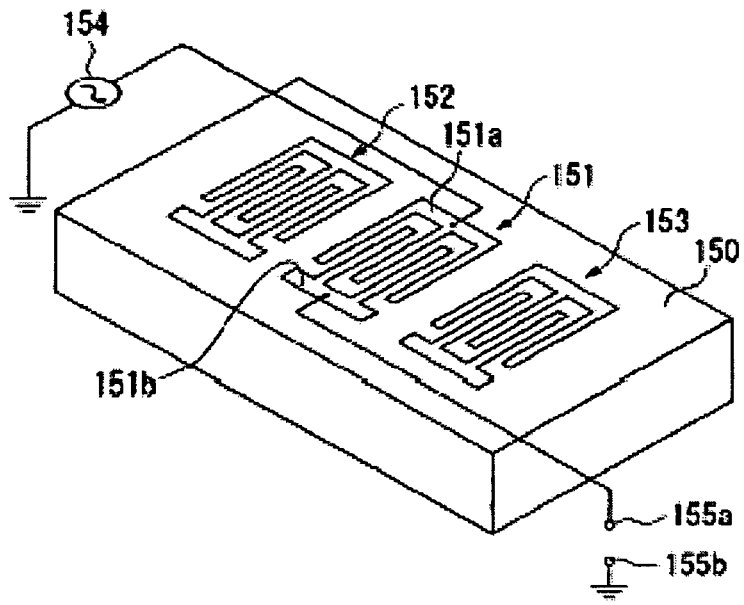
FIG. 21 is a perspective view of an oscillator in accordance with a fourth embodiment of the invention.

4. Fourth Embodiment 4.1. Next, an oscillator in accordance with a fourth embodiment of the invention is described with reference to the accompanying drawings. FIG. 21 is a view schematically showing an oscillator in accordance with the present embodiment.

As shown in FIG. 21, the oscillator has a base substrate 150. As the base substrate 150, a potassium niobate deposited body in accordance with an embodiment of the invention, for example, the potassium niobate deposited body 100 shown in FIG. 1 may be used, like the frequency filter described above.

An IDT electrode 151 is formed on an upper surface of the base substrate 150, and IDT electrodes 152 and 153 are formed in a manner to interpose the IDT electrode 151. A high frequency signal source 154 is connected to one of comb teeth-shaped electrodes 151a which form the IDT electrode 151, while a signal line is connected to the other comb teeth-shaped electrode 151b. It is noted that the IDT electrode 151 corresponds to an electric signal application electrode, and the IDT electrodes 152 and 153 correspond to resonating electrodes for resonating a specific frequency component or a specific band frequency component of the surface acoustic waves generated by the IDT electrode 151.

4.2. Next, operations of the oscillator described above are described.

When a high frequency signal is outputted from the high frequency signal source 154 in the above-described structure, this high frequency signal is impressed on one of the comb teeth-shaped electrodes 151a of the IDT electrode 151. As a result, surface acoustic waves that propagate toward the IDT electrode 152 and surface acoustic waves that propagate toward the IDT electrode 153 are generated on the upper surface of the base substrate 150. Of these surface acoustic waves, those surface acoustic waves of a specific frequency component are reflected at the IDT electrode 152 and the IDT electrode 153, and a standing wave is generated between the IDT electrode 152 and the IDT electrode 153. The surface acoustic wave with this specific frequency component is repeatedly reflected at the IDT electrode 152 and the IDT electrode 153. As a result, specific frequency components or specific band frequency components are resonated and the amplitude increases. A portion of the surface acoustic waves of the specific frequency component or the specific band frequency component are extracted from the other comb teeth-shaped electrode 151b of the IDT electrode 151, and the electric signal of the frequency (or the frequency having a certain band) corresponding to the resonance frequency between the IDT electrode 152 and the IDT electrode 153 can be extracted at terminals 155a and 155b.

Figure 22:
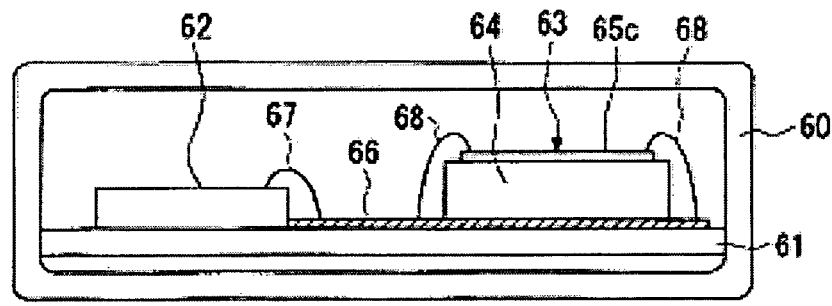
FIG. 22 is a schematic view of an example in which the oscillator in accordance with the fourth embodiment is applied to a VCSO.
Figure 23:
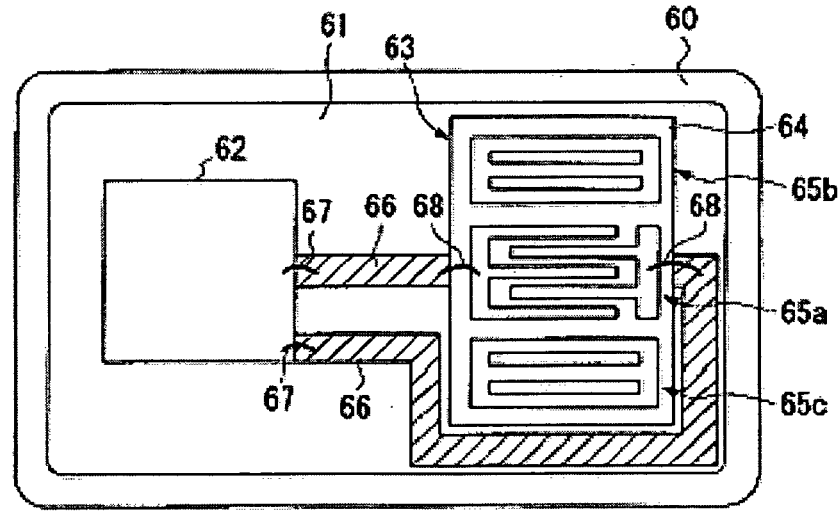
FIG. 23 is a schematic view of the example in which the oscillator in accordance with the fourth embodiment is applied to a VCSO.

4.3. FIG. 22 and FIG. 23 are views schematically showing an example in which the oscillator described above is applied as a VCSO (Voltage Controlled SAW Oscillator). FIG. 22 is a cut-out side view, and FIG. 23 is a cut-out plan view.

The VCSO is housed inside a metallic (aluminum or stainless) box 60. An IC (integrated circuit) 62 and an oscillator 63 are mounted on a substrate 61. In this case, the IC 62 controls the frequency to be applied to the oscillator 63 in response to the voltage inputted from an external circuit (not shown).

The oscillator 63 includes IDT electrodes 65a, 65b and 65c formed on a base substrate 64. Its structure is generally the same as that of the oscillator shown in FIG. 21. As the base substrate 64, like the oscillator described above and shown in FIG. 21, a potassium niobate deposited body in accordance with an embodiment of the invention, for example, the potassium niobate deposited body 100 shown in FIG. 1 may be used.

A wiring 66 for electrically connecting the IC 62 and the oscillator 63 is patterned on the substrate 61. For example, the IC 62 and the wiring 66 are connected by a wire line 67 such as a gold line, and the oscillator 63 and the wiring 66 are connected by a wire line 68 such as a gold line, whereby the IC 62 and oscillator 63 are electrically connected to each other through the wiring 66.

Figure 24:
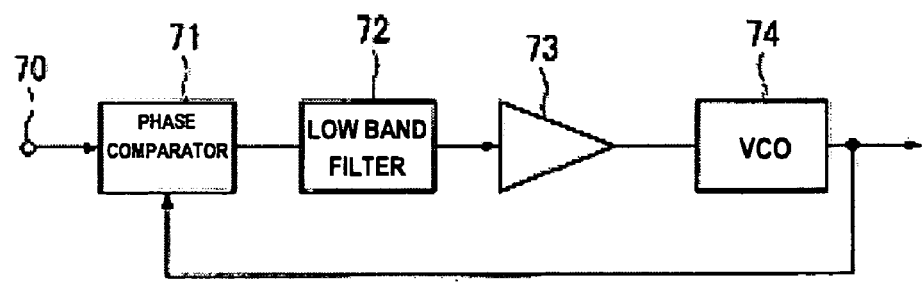
FIG. 24 is a block diagram of the basic structure of a PLL circuit.

The VCSO shown in FIG. 22 and FIG. 23 can be employed as a VCO (Voltage Controlled Oscillator) for a PLL circuit shown in FIG. 24, for example. FIG. 24 is a block diagram showing the basic structure of a PLL circuit. The PLL circuit is formed from a phase comparator 71, a low band filter 72, an amplifier 73 and a VCO 74. The phase comparator 71 compares the phases (or frequencies) of signals inputted from an input terminal 70 and outputted from the VCO 74, and outputs an error voltage signal, the value of which is set according to the difference between these signals. The low band filter 72 transmits only the low frequency components at the position of the error voltage signal outputted from the phase comparator 71. The amplifier 73 amplifies the signal outputted from the low band filter 72. The VCO 74 is an oscillator circuit in which the oscillation frequency oscillating according to the voltage value inputted is continuously changed within a certain range.

The PLL circuit having such a structure operates so as to decrease the difference between the phases (or frequencies) inputted from the input terminal 70 and outputted from the VCO 74, and synchronizes the frequency of the signal outputted from the VCO 74 with the frequency of the signal inputted from the input terminal 70. When the frequency of the signal outputted from the VCO 74 and the frequency of the signal inputted from the input terminal 70 are synchronized with each other, the PLL circuit outputs a signal that matches with the signal inputted from the input terminal 70 after excluding a specific phase difference, and conforms to the changes in the input signal.

As described above, frequency filters and oscillators in accordance with the embodiment of the invention have surface acoustic wave elements having a high electromechanical coupling coefficient in accordance with the embodiment of the invention. Therefore, in accordance with the present embodiment, miniaturization of frequency filters and oscillators can be realized.

Figure 25:
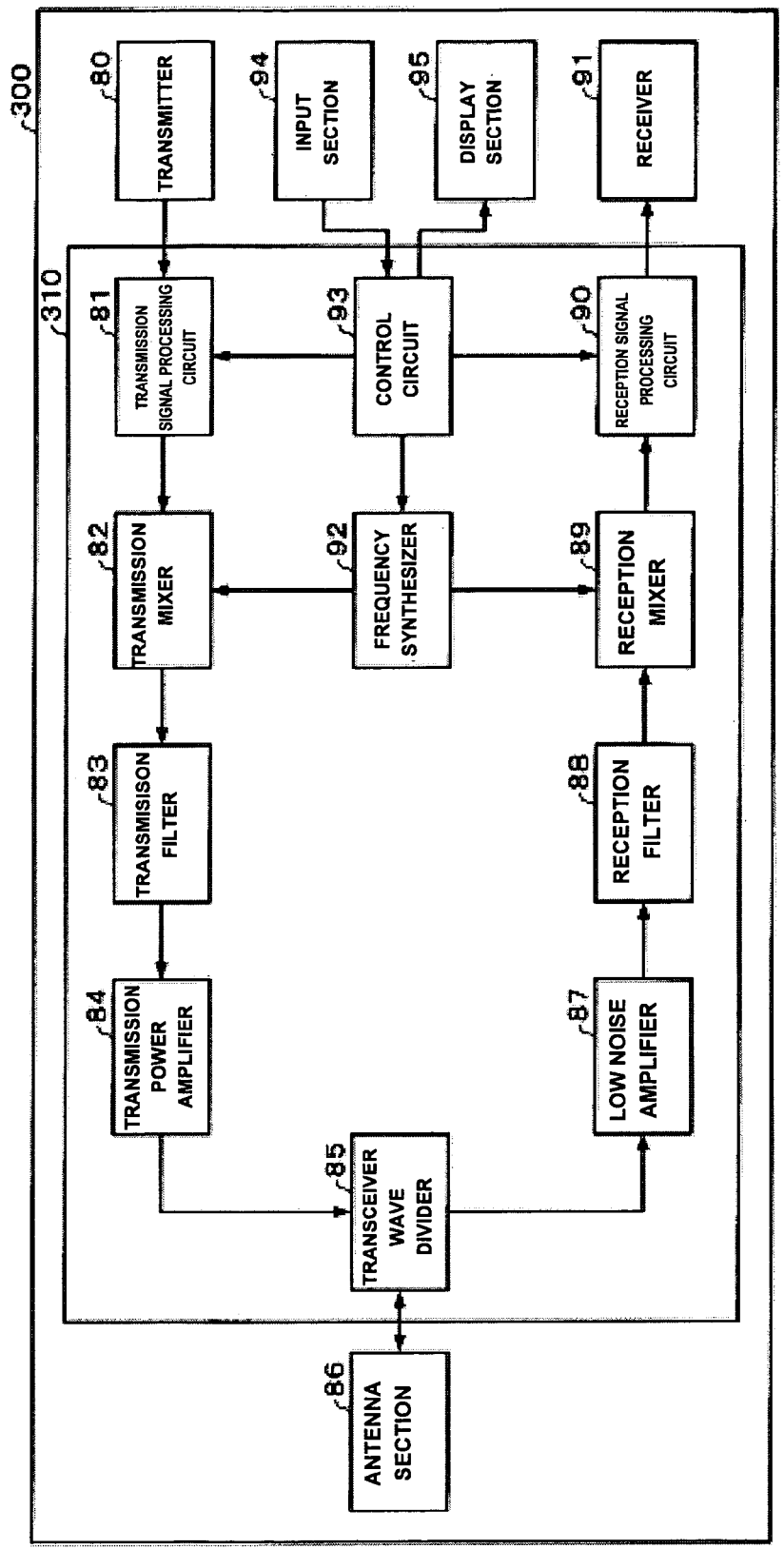
FIG. 25 is a block diagram showing the structure of an electronic circuit in accordance with a fifth embodiment of the present invention.

5. Fifth Embodiment 5.1. Next, first examples of an electronic circuit and an electronic apparatus in accordance with a fifth embodiment of the invention are described with reference to the accompanying drawings. FIG. 25 is a block diagram showing an electrical structure of an electronic circuit 300 in accordance with the embodiment. It is noted that the electronic apparatus 300 may be, for example, a cellular phone.

The electronic apparatus 300 has an electronic circuit 310, a transmitter 80, a receiver 91, an input section 94, a display section 95, and an antenna section 86. The electronic circuit 310 has a transmission signal processing circuit 81, a transmission mixer 82, a transmission filter 83, a transmission power amplifier 84, a transceiver wave divider 85, a low noise amplifier 87, a reception filter 88, a reception mixer 89, a reception signal processing circuit 90, a frequency synthesizer 92, and a control circuit 93.

In the electronic circuit 310, the frequency filters shown in FIG. 20 can be used as the transmission filter 83 and the reception filter 88. The frequency that is filtered (i.e., the frequency which is permitted to pass through the filter) is set separately at the transmission filter 83 and the reception filter 88 according to the required frequency in the signal outputted from the transmission mixer 82 and the required frequency at the reception mixer 89. As the VCO 74 of the PLL circuit (see FIG. 24) that is provided within the frequency synthesizer 92, the oscillator shown in FIG. 21 or the VCSO shown in FIGS. 22 and 23 can be used.

The transmitter 80 can be realized, for example, with a microphone which converts sound wave signals into electric signals. The transmission signal processing circuit 81 is a circuit for performing such processing as D/A conversion, modulation, etc. on the electric signal to be outputted from the transmitter 80. The transmission mixer 82 mixes the signal outputted from the transmission signal processing circuit 81 using the signal outputted from the frequency synthesizer 92. The transmission filter 83 permits passage of only those signals of the required frequency from among the intermediate frequencies (hereafter referred to as "IF"), and cuts unnecessary frequency signals. The signal outputted from the transmission filter 83 is converted to an RF signal by a converting circuit (not shown). The transmission power amplifier 84 amplifies the power of the RF signal outputted from the transmission filter 83 and outputs this amplified result to the transceiver wave divider 85.

The transceiver wave divider 85 transmits the RF signal that is outputted from the transmission power amplifier 84 through the antenna section 86 in the form of radio waves. Also, the transceiver wave divider 85 divides the reception signal received by the antenna 86, and outputs the result to the low noise amplifier 87. The low noise amplifier 87 amplifies the reception signal from the transceiver wave divider 85. It is noted that the signal outputted from the low noise amplifier 87 is converted to IF by a converting circuit (not shown).

The reception filter 88 permits passage of only those signals of the required frequency from among the IF that were converted by a converting circuit (not shown), and cuts unnecessary frequency signals. The reception mixer 89 uses the signal outputted from the frequency synthesizer 92 to mix the signals outputted from the reception filter 88. The reception signal processing circuit 90 performs such processing as A/D conversion, demodulation, etc., to the signal outputted from the reception mixer 89. The receiver 91 is realized with, for example, a small speaker or the like which converts electrical signals into sound waves.

The frequency synthesizer 92 is a circuit that generates the signal to be supplied to the transmission mixer 82 and the signal to be supplied to the reception mixer 89. The frequency synthesizer 92 is equipped with a PLL circuit. The frequency synthesizer 92 divides the signal outputted from this PLL circuit and can generate a different signal. The control circuit 93 controls the transmission signal processing circuit 81, the reception signal processing circuit 90, the frequency synthesizer 92, the input section 94, and the display section 95. The display section 95 displays, for example, the device status to the user of the cellular phone. The input section 94 is provided, for example, for the user of the cellular phone to input directions.

Figure 26:
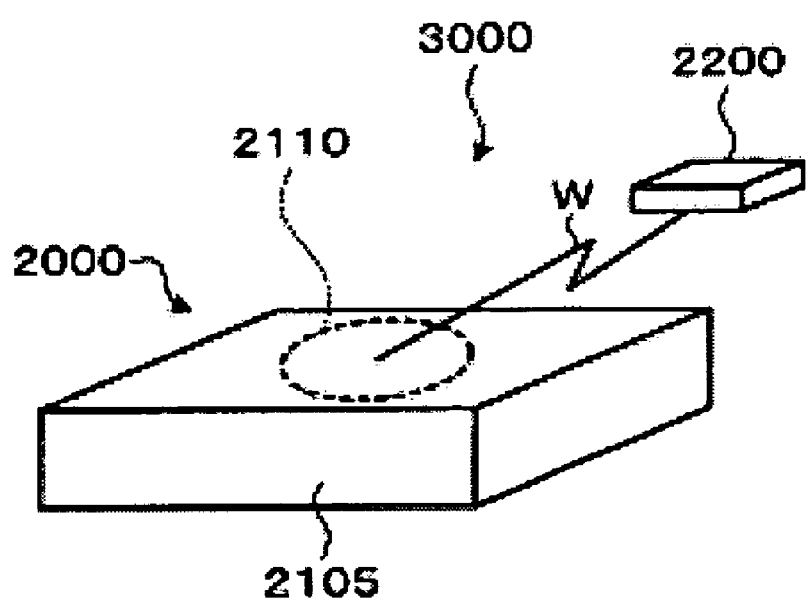
FIG. 26 is a view showing a communications system that uses a reader/writer in accordance with the fifth embodiment of the present invention.
Figure 27:
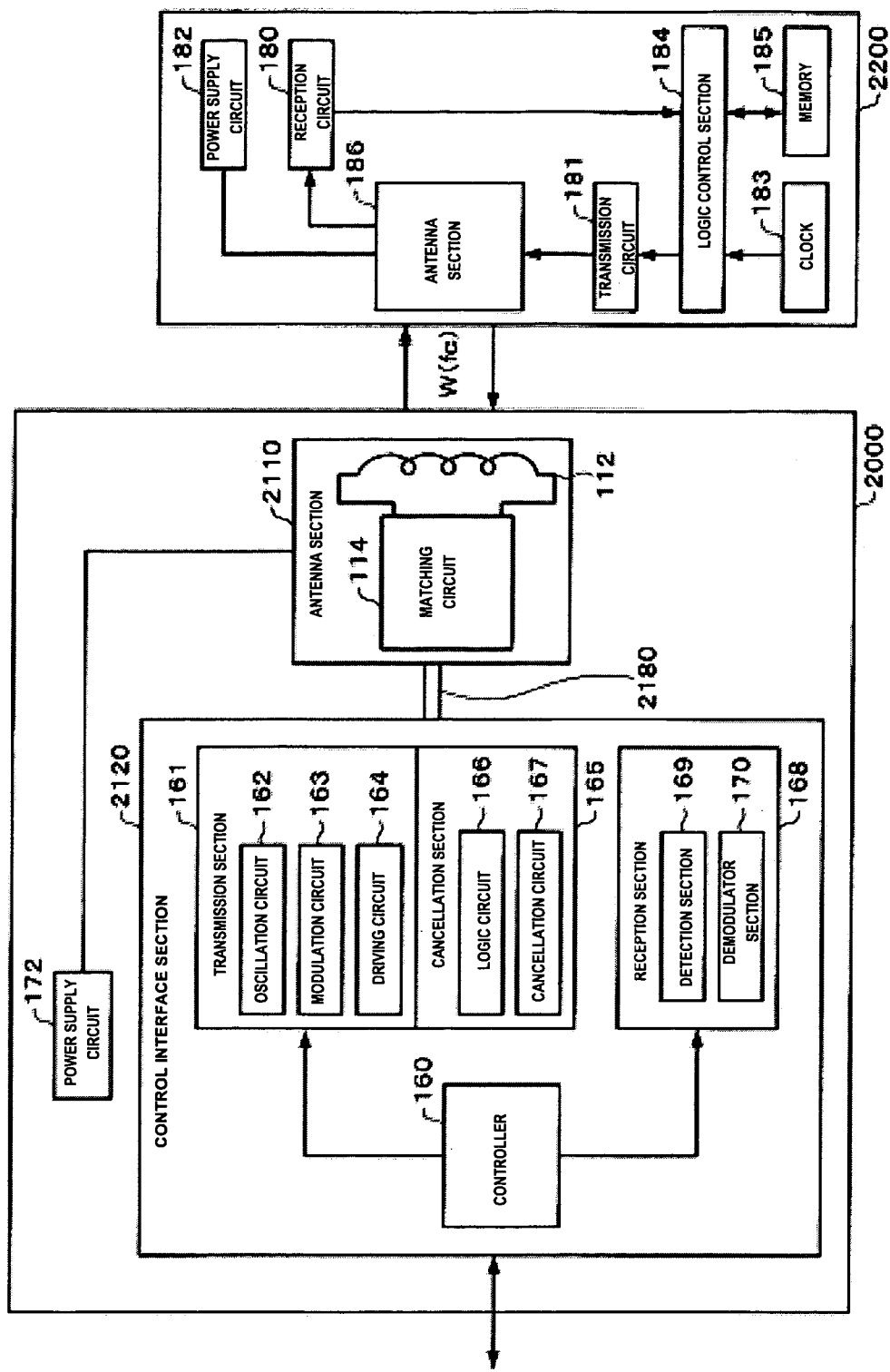
FIG. 27 is a schematic block diagram of the communications system shown in FIG. 26.

5.2. Next, second examples of an electronic circuit and an electronic apparatus in accordance with the fifth embodiment of the invention are described with reference to the accompanying drawings. In the present embodiment, a reader/writer 2000 and a communications system 3000 using the same are described as examples of an electronic apparatus. FIG. 26 is a view showing the communications system 3000 that uses the reader/writer 2000 in accordance with the present embodiment, and FIG. 27 is a schematic block diagram of the communications system 3000 shown in FIG. 26.

As shown in FIG. 26, the communications system 3000 includes the reader/writer 2000 and a contactless information medium 2200. The reader/writer 2000 transmits a radio wave W (hereafter also referred to as a "career") having a carrier frequency $f_c$ to the contactless information medium 2200 or receives the same from the contactless information medium 2200, to thereby communicate with the contactless information medium 2200 by using radio communications. The radio wave W can use any carrier frequency fc in an arbitrary frequency band. As shown in FIG. 26 and FIG. 27, the reader/writer 2000 has a main body 2105, an antenna section 2110 located on the top surface of the main body 2105, a control interface section 2120 stored in the main body 2105, and a power supply circuit 172. The antenna section 2110 and the control interface section 2120 are electrically connected to each other by a cable 2180. Further, although not shown, the reader/writer 2000 is connected to an external host apparatus (processor apparatus, etc.) through the control interface section 2120.

The antenna section 2110 has a function to communicate information with the contactless information medium 2200. The antenna section 2110 has a prescribed communication area (area shown by a dotted line), as shown in FIG. 26. The antenna section 2110 is composed of a loop antenna 112 and a matching circuit 114.

The control interface section 2120 includes a transmission section 161, a damping oscillation cancellation section (hereafter, referred to as a "cancellation section") 165, a reception section 168, and a controller 160.

The transmission section 161 modulates data transmitted from an external unit (not shown), and transmits the same to a loop antenna 112. The transmission section 161 has an oscillation circuit 162, a modulation circuit 163, and a driving circuit 164. The oscillation circuit 162 is a circuit for generating a carrier with a predetermined frequency. The oscillation circuit 162 is usually formed with a quartz oscillator or the like. By using the oscillator in accordance with the embodiment described above, its communication frequency can be improved to a higher frequency and its detection sensitivity can be improved. The modulation circuit 163 is a circuit that modulates the carrier according to information given. The driving circuit 164 receives the modulated career, amplifies its electric power, and drives the antenna section 2110.

The cancellation section 165 has a function to control a damped oscillation generated by the loop antenna 112 of the antenna section 2110 which occurs with ON/OFF of the career. The cancellation section 165 includes a logic circuit 166 and a cancellation circuit 167.

The reception section 168 includes a detection section 169 and a demodulator circuit 170. The reception section 168 demodulates a signal that is transmitted from the contactless information medium 2200. The detection section 169 detects a change in the current that circulates in the loop antenna 112. The detection section 169 may include, for example, an RF filter. As the RF filter, a quartz oscillator or the like may be used. By using the frequency filter in accordance with the embodiment described above, the communication frequency can be improved to a higher frequency, the detection sensitivity can be improved, and miniaturization becomes possible. The demodulator circuit 170 demodulates the changed portion detected by the detection section 169.

The controller 160 retrieves information from the demodulated signal, and transfers the same to an external device. The power supply circuit 172 receives the supply of an electric power from outside, appropriately converts the voltage, and supplies a necessary electric power to each circuit. It is noted that a built-in battery may be used as the power source.

The contactless information medium 2200 communicates with the reader/writer 2000 by using electromagnetic waves (radio waves). As the contactless information medium 2200, for example, a contactless IC tag, a contactless IC card or the like can be enumerated.

Next, operations of the communication system 3000 that uses the reader/writer 2000 in accordance with the present embodiment are described. When data is sent to the contactless information medium 2200 from the reader/writer 2000, if the data is sent from an external device (not shown), the data is processed by the controller 160 in the reader/writer 2000 and sent to the transmission section 161. In the transmission section 161, a high frequency signal of constant amplitude is supplied from the oscillation circuit 162 as a career, the career is modulated by the modulation circuit 163, and a modulated high frequency signal is outputted. The modulated high frequency signal outputted from the modulation circuit 163 is supplied to the antenna section 2110 through the driving circuit 164. At the same time, the cancellation section 165 generates a predetermined pulse signal in synchronism with an OFF timing of the modulated high frequency signal, to thereby contribute to the control of the damping oscillation in the loop antenna 112.

In the contactless information medium 2200, the modulated high frequency signal is supplied through an antenna section 186 to a reception circuit 180. Also, the modulated high frequency signal is supplied to a power supply circuit 182, and a predetermined power supply voltage necessary for each section of the contactless information medium 2200 is generated. The data outputted from the reception circuit 180 is demodulated and supplied to a logic control circuit 184. The logic control circuit 184 operates based on the output of a clock 183, processes the supplied data, and writes certain data in a memory 185.

When data is sent from the contactless information medium 2200 to the reader/writer 2000, the following operations take place. In the reader/writer 2000, a high frequency signal of constant amplitude is outputted from the modulation circuit 163 without being modulated. The high frequency signal is sent to the contactless information medium 2200 through the driving circuit 164 and the loop antenna 112 of the antenna section 2110.

In the contactless information medium 2200, data read from the memory 185 is processed by the logic control circuit 184, and supplied to a transmission circuit 181. The transmission circuit 181 may have a switch, wherein the switch turns ON and OFF according to "1" and "0" bit of the data.

In the reader/writer 2000, when the switch of the transmission circuit 181 turns ON and OFF, the load on the loop antenna 112 of the antenna section 2110 changes. Therefore, the amplitude of the high frequency current that circulates in the loop antenna 112 changes. In other words, the high frequency current is amplitude-modulated by the data supplied from the contactless information medium 2200. The high frequency current is detected by the detection section 169 of the reception section 168, and demodulated by the demodulation circuit 170 whereby data is obtained. The data is processed by the controller 160, and transmitted to an external apparatus or the like.

5.3. Electronic circuits and electronic apparatuses in accordance with the embodiment of the invention have surface acoustic wave elements having a high electromechanical coupling coefficient in accordance with the embodiment of the invention. Therefore, in accordance with the present embodiment, power saving of electronic circuits and electronic apparatuses can be achieved.

The embodiments of the invention are described above in detail. However, those skilled in the art should readily understand that many modifications can be made without substantially departing from the novel matter and effects of the invention. Accordingly, all of such modified examples are also included in the scope of the invention.

For example, frequency filters and oscillators in accordance with the embodiments of the invention are also applicable to wide-band filters and VCOs in UWB systems, cellular phones, and wireless LAN.

Although the surface acoustic wave element, frequency filter, frequency oscillator, electronic circuit, electronic equipment, and reader/writer in accordance with the embodiments of the present invention are described above, the present invention can be freely modified within the scope of the present invention without being limited to the embodiments described above.

For example, in the embodiments described above, a cellular phone and a communications system using a reader/writer device are described as examples of electronic apparatuses, and electronic circuits installed in the cellular phone and the reader/writer device are described as examples of electronic circuits. However, the invention is not limited to those described above, and is applicable to various mobile telecommunications equipment and electronic circuits installed therein. For example, the invention is also applicable to floor type telecommunications equipment such as tuners that receive BS (Broadcast Satellite) broadcasting and electronic circuits installed therein, and also applicable to electronic equipment such as HUB or the like that use optical signals that propagate in optical cables and electronic circuits installed therein.

What is claimed is:

1. A potassium niobate deposited body comprising:
   an R-plane sapphire substrate; and
   a potassium niobate layer or a potassium niobate solid solution layer formed above the R-plane sapphire substrate,
   wherein the potassium niobate layer or the potassium niobate solid solution layer epitaxially grows in a (100) orientation in a pseudo cubic system expression, and
   the potassium niobate layer or the potassium niobate solid solution layer has a (100) plane that tilts with a [11-20] direction vector as a rotation axis with respect to an R-plane (1-102) of the R-plane sapphire substrate.

2. A potassium niobate deposited body according to claim 1, wherein an angle defined between the (100) plane of the potassium niobate layer or the potassium niobate solid solution layer and the R-plane (1-102) of the R-plane sapphire substrate is one degree or greater but 15 degrees or smaller.

3. A potassium niobate deposited body according to claim 1, wherein the potassium niobate layer includes a domain that epitaxially grows in a b-axis orientation, when a lattice constant of orthorhombic potassium niobate is $2^{1/2}b<a<c$, and c-axis is a polarization axis, and the b-axis tilts with a [11-20] direction vector as a rotation axis with respect to the R-plane (1-102) of the R-plane sapphire substrate.

4. A potassium niobate deposited body according to claim 3, wherein an angle defined between the b-axis and the R-plane (1-102) of the R-plane sapphire substrate is one degree or greater but 15 degrees or smaller.

5. A potassium niobate deposited body according to claim 1, wherein the potassium niobate solid solution layer consists of a solid solution that is expressed by $K_{1-x}Na_xNb_{1-y}Ta_yO_3$ (0<x<1, 0<y<1).

6. A potassium niobate deposited body according to claim 1, comprising a buffer layer formed above the R-plane sapphire substrate, wherein the potassium niobate layer or the potassium niobate solid solution layer is formed above the buffer layer.

7. A potassium niobate deposited body according to claim 6, wherein the buffer layer epitaxially grows in a cubic (100) orientation, and a (100) plane of the buffer layer tilts with a [11-20] direction vector as a rotation axis with respect to the R-plane (1-102) of the R-plane sapphire substrate.

8. A potassium niobate deposited body according to claim 7, wherein an angle defined between the (100) plane of the buffer layer and the R-plane (1-102) of the R-plane sapphire substrate is one degree or greater but 15 degrees or smaller.

9. A potassium niobate deposited body according to claim 6, wherein the buffer layer consists of a metal oxide having a rock salt structure.

10. A potassium niobate deposited body according to claim 9, wherein the metal oxide is magnesium oxide.

11. A surface acoustic wave element comprising the potassium niobate deposited body according to claim 1.

12. A frequency filter comprising the surface acoustic wave element according to claim 11.

13. An electronic circuit comprising the frequency filter according to claim 12.

14. An electronic apparatus comprising the electronic circuit according to claim 13.

15. An oscillator comprising the surface acoustic wave element according to claim 11.

16. An electronic circuit comprising the oscillator according to claim 15.

17. An electronic apparatus comprising the electronic circuit according to claim 16.

18. A potassium niobate deposited body comprising:
an R-plane sapphire substrate;
a buffer layer formed above the R-plane sapphire substrate; and
a potassium niobate layer or a potassium niobate solid solution layer formed above the buffer layer,
wherein the buffer layer epitaxially grows in a cubic (100) orientation, and
a (100) plane of the buffer layer tilts with a [11-20] direction vector as a rotation axis with respect to an R-plane (1-102) of the R-plane sapphire substrate.

19. A method for manufacturing a potassium niobate deposited body comprising:
forming above an R-plane sapphire substrate a potassium niobate layer or a potassium niobate solid solution layer that epitaxially grows in a (100) orientation in a pseudo cubic system expression,
wherein a (100) plane of the potassium niobate layer or the potassium niobate solid solution layer is formed to tilt with a [11-20] direction vector as a rotation axis with respect to an R-plane (1-102) of the R-plane sapphire substrate.

* * * * *